United States Patent
Botma

(10) Patent No.: US 6,924,885 B2
(45) Date of Patent: Aug. 2, 2005

(54) LITHOGRAPHIC APPARATUS AND DEVICE MANUFACTURING METHOD

(75) Inventor: Hako Botma, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 42 days.

(21) Appl. No.: 10/734,639

(22) Filed: Dec. 15, 2003

(65) Prior Publication Data

US 2004/0165168 A1 Aug. 26, 2004

(30) Foreign Application Priority Data

Dec. 23, 2002 (EP) ............................................. 02080456

(51) Int. Cl.$^7$ ........................ G03B 27/72; G03B 27/42; G03B 27/54; G03B 27/32
(52) U.S. Cl. ............................. 355/71; 355/53; 355/67; 355/77
(58) Field of Search .............................. 355/53, 67, 71, 355/77; 430/311

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 6,259,512 B1 * | 7/2001 | Mizouchi | 355/67 |
| 6,452,662 B2 * | 9/2002 | Mulkens et al. | 355/67 |
| 6,671,035 B2 * | 12/2003 | Eurlings et al. | 355/71 |

FOREIGN PATENT DOCUMENTS

| | | |
|---|---|---|
| EP | 1 109 067 A2 | 6/2001 |
| EP | 1 109 067 A3 | 6/2003 |
| WO | WO98/33096 | 7/1998 |
| WO | WO98/38597 | 9/1998 |
| WO | WO98/40791 | 9/1998 |

\* cited by examiner

Primary Examiner—Alan Mathews
(74) Attorney, Agent, or Firm—Pillsbury Winthrop Shaw Pittman LLP

(57) ABSTRACT

A projection beam PB is projected onto a substrate W via a mask MA. The direction dependence of the intensity of the beam at the substrate W is controlled by passing the beam through a series of optical elements 120$a$–$b$ in front of a pupil plane 14. The intensity distribution as a function of position in the pupil plane 14 determines the angle dependence at the substrate W. The optical elements 120$a$–$b$, which are preferably arrays of microlenses (or more particularly DOE's: Diffractive Optical Elements) each define an angle dependence of the intensity of the beam PB. The optical elements 120$a$–$b$ are each arranged to pass a major part of the beam PB substantially without deflection and a minor part with a deflection angle dependent intensity. The major part of the beam is blocked out of the beam behind the series of optical elements 120$a$–$b$. As a result an addition of the effects of upon the intensity in the pupil plane 14 is realized.

18 Claims, 2 Drawing Sheets

LITHOGRAPHIC APPARATUS AND DEVICE MANUFACTURING METHOD

BACKGROUND OF THE INVENTION

This application claims priority from European Patent Application 02080456.3, filed Dec. 23, 2002 which is herein incorporated by reference in its entirety.

1. Field of the Invention

The present invention relates generally to lithographic apparatus and more particularly to lithographic apparatus including spatially modulated illumination nodes.

2. Description of the Prior Art

The term "patterning device" or "patterning structure" as here employed should be broadly interpreted as referring to devices that can be used to endow an incoming beam of radiation with a patterned cross-section, corresponding to a pattern that is to be created in a target portion of the substrate; the term "light valve" can also be used in this context. Generally, said pattern will correspond to a particular functional layer in a device being created in the target portion, such as an integrated circuit or other device (see below). Examples of such patterning device include:

A mask. The concept of a mask is well known in lithography, and it includes mask types such as binary, alternating phase-shift, and attenuated phase-shift, as well as various hybrid mask types. Placement of such a mask in a radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A Programmable Mirror Array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference.

In the case of a programmable mirror array, said support structure may be embodied as a frame or table, for example, which may be fixed or movable as required; and A Programmable LCD Array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The illumination system has to ensure the realization of a desired intensity distribution at the substrate as a function of position across the beam and as a function of angle of incidence of different rays in the beam. The desired position dependence, excluding mask generated patterns, generally has to be uniform with constant intensity as a function of position on the substrate, and the desired angle dependence has to peak at certain angles. The desired angle dependence may depend on the nature of the pattern on the mask. Since different patterns need to be imaged, it has to be possible to change the angular dependency of the illumination of the mask.

European Patent application EP 1109067, which is incorporated herein by reference, describes examples of such an illumination system. Herein, the illumination system has a laser source, followed by an optical element such as a Diffractive Optical Element (DOE) and a lens. The lens is followed by an optical sub-system that passes the beam to the mask. The optical sub-system uses a plane after the DOE and the lens as a pupil plane for illuminating the mask. The pupil plane is in the focus plane of the optical sub-system, so that the spatial intensity distribution of the beam in the pupil plane determines the angular intensity distribution of the beam at the mask and the substrate ("angle" in this context may refer to the angle relative to the main direction of the beam, as well as to an angle rotated around that main direction). For the sake of completeness, it may be noted that an illumination system may further comprise a reflective integrator, such as for example a quartz rod, which will cause the beam to experience a number of reflections, so that in fact the angle dependence of the intensity distribution of the beam at the mask is determined by the overlap of a number of mirrored copies of an initial intensity distribution before the reflective integrator.

EP 1109067 uses the DOE to control the spatial intensity distribution of the beam in the pupil plane, and thereby to control the angular intensity distribution at the substrate. It is described for example, how the function of an axicon (providing zero intensity in a circle in the centre of the pupil plane) can be combined with a DOE. Basically the DOE comprises an array of microlenses, each defining a region transverse to the direction of the beam, through which radiation from the beam is passed. Conventionally, the region of each microlens has a circular or hexagonal shape, which would lead to a circle or hexagonal shaped intensity distribution in the pupil plane. However, by using different shapes, different distributions can be realized. For example, by using pie shaped microlenses, which pass radiation only through a part of a circle, a pie shaped intensity distribution can be realized in the pupil plane. Similarly, a dipole shaped region, with lobes that pass radiation emanating in mutually opposite directions from the centre of the lens, can be realized in the pupil plane. By using an array of identical microlenses across the beam, the inhomogeneity of the beam does not significantly affect the intensity distribution in the pupil plane.

Dependent on the particular integrated circuit topology under process, or even the particular process step, different position dependencies of the intensity distribution in the pupil plane may be needed. For this purpose EP 1109067 provides a DOE exchange unit, so that a DOE for creating a desired intensity distribution can be introduced into the beam as needed.

Since the DOE plays a crucial role in realizing the desired intensity distribution in the pupil plane, it is usually necessary to design DOE's specifically for different possible desired intensity distributions and to change the DOE, dependent on the desired distribution. However, if a specific DOE must be designed and made for each possible desired intensity distribution, a considerable delay for designing and manufacturing the DOE results each time a new intensity distribution is needed. Also a very large number of DOE's is needed in this way.

EP 1109067 also describes various ways to place a number of different DOE's in parallel in the incoming beam. Each DOE redirects a part of the beam cross-section, so that the intensity at the pupil plane is a sum of contributions from different DOE's. New intensity distributions can be generated by using different combinations of DOE's without manufacturing new DOE's.

Of course this requires a homogeneous distribution of the incoming beam over the various DOE's. Thus, one of the main advantages of using DOE's is sacrificed to a certain extent: the fact that an array of microlenses with identical effect is used in parallel, so that inhomogeniety of the beam does not matter. To alleviate this inhomogeneity a large number of parallel DOE's is required, assembled at random over the beam area. This makes assembly and re-use complicated.

Furthermore EP 1109067 describes serial placement of different DOE's in the path of the beam. For example, one DOE generates a ring-shaped pupil (which is normally done by an axicon) while another (serially placed) DOE generates a filled, circular pupil. The effect of serial placement is to convolute the position dependencies imparted by the various DOE's to the intensity distribution in the pupil plane. Convolution of a first and second intensity pattern has the effect of spreading each point of the first intensity pattern with a distribution determined by the second pattern. Thus convolution can be used for example to widen a ring in a pattern where the intensity is limited to a ring shaped region in the pupil plane. However, convolution generally does not provide refined control over the intensity distribution, in particular when a number of DOE's are placed in series. Accordingly, EP 1109067 uses the convolution of different DOE's in serial placement for specific purposes, like the above mentioned broadening of the ringwidth (instead of using zoom-optics). Another example is that one DOE generates a circular pupil which due to different optical losses in the x- and y-direction gets non-circular (e.g. elliptical) at reticle level. This might lead to different widths of horizontal lines as compared to vertical lines on the wafer.

This ellipticity can be compensated by serially inserting a second DOE which radiates preferably in one direction, the convolution of which with the first DOE gives the wanted circular pupil at reticle level.

However, for other types of composition convolution is less suitable. Thus specific new intensity distributions in the pupil plane, for example, generally still require parallel arrangement of DOE's or a lengthy and costly manufacture of new DOE's.

SUMMARY OF THE INVENTION

An aspect of embodiments of the present invention provides for a lithographic apparatus in which the intensity distribution of a beam in a pupil plane can be composed and modified quickly without relying on the homogeneity of the beam.

A further aspect of embodiments allow for to control of the intensity as a function of the angle of rotation around a centre of the pupil plane in this way.

Another aspect of embodiments of the present invention provides for a lithographic apparatus in which more and faster control is afforded over the intensity distribution in the pupil plane when premanufactured DOE's are placed in series.

According to embodiments of the invention an intensity distribution in the pupil plane is composed by serial arrangement of a number of optical elements each for deflecting the beam over a range of directions with a direction dependent intensity distribution. The optical elements have been designed so that each passes a major part of the beam without deflection, only a minor part being deflected with a direction dependent intensity distribution specific to the optical element. By a major part of the beam is meant more than half of the beam power of the beam. In certain embodiments, even more than 80% or even 90% or 98% of the beam power that is passed is passed undeflected. Conventional optical elements for deflecting a beam of radiation are manufactured with a goal of 100% efficiency, i.e. substantially 0% of the beam passes undeflected. The optical elements according to the present invention are thus deliberately manufactured having a relatively very low efficiency. The part of the beam that is passed undeflected by all optical elements is blocked out before it reaches the substrate. As a result the intensity distribution in the pupil plane is approximately a summation of the patterns imparted by the individual optical elements instead of a convolution.

In an embodiment, the optical elements include at least one and in another embodiment, at least two optical elements that by themselves would induce an intensity distribution in the pupil plane, so that the pattern varies as a function of the rotation angle around the main beam direction. By combining such optical elements various rotation angle dependent patterns can be composed.

Each optical element in the series arrangement may comprise an array of microlenses that are all designed to provide the desired pattern of intensity in the pupil defined by that optical element plus an undeflected part of the beam. Thus, the optical element is spatially homogeneous across the beam, and insensitive for inhomogeneity of the beam. Fine grain interspersed with the microlenses "flat" optical parts may be included in the array (preferably in each unit cell of the array) to pass the major part of the beam undeflected.

In one embodiment, the microlenses are designed as diffractive optical elements, by introducing steps of a fixed size in the thickness of the microlenses so as to restrict the range of thickness values of the microlenses. Conventionally, the step size is equal to an integer number of wavelengths of radiation from the (monochromatic) radiation source, since such a step does result in optimal efficiency. According to the invention microlenses can be used that have been designed for a wavelength that differs from the wavelength of the beam, i.e. so that the wavelength of the beam differs from the wavelength for which the microlenses are optimally efficient. This difference from the optimal wavelength is taken so large that the major part of the projection beam is passed undeflected.

In certain embodiments, the intensity in each of a number of respective ranges of the pupil plane is controlled mainly by a respective one of the optical element that have been placed in series. Thus, different optical elements may be used of which each controls the rotation angle dependence of the intensity in a respective ring in the pupil plane (or at least is more determinative of the intensity in that ring than other ones of the optical elements). The optical elements may be rotated to a selectable angle so as to control an offset of the rotation angle dependence in the pupil plane. Instead of in ring shaped ranges, the optical element may control the intensity distribution in ranges of other shapes, e.g. in rectangular "pixels" in the pupil plane. A set of optical elements may be provided for each range, so that the intensity distribution in each range of the pupil plane can be selected substantially independently from that in other ranges.

The optical elements as referred to above can be placed in series by positioning them along an optical axis contiguously, i.e. side by side in close proximity. Alternatively, they can be positioned in optically conjugate planes, which is achieved for example by providing a 1:1 relay optics in between two successive optical elements. Thus, both optical elements can be put exactly in a focus plane, whereas in contiguous placement, only one of the optical elements is positioned exactly in a focus plane. As an alternative for a 1:1 relay optics an imaging system with a magnification factor other than 1 can be used.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PRESENT INVENTION

Figure 1:
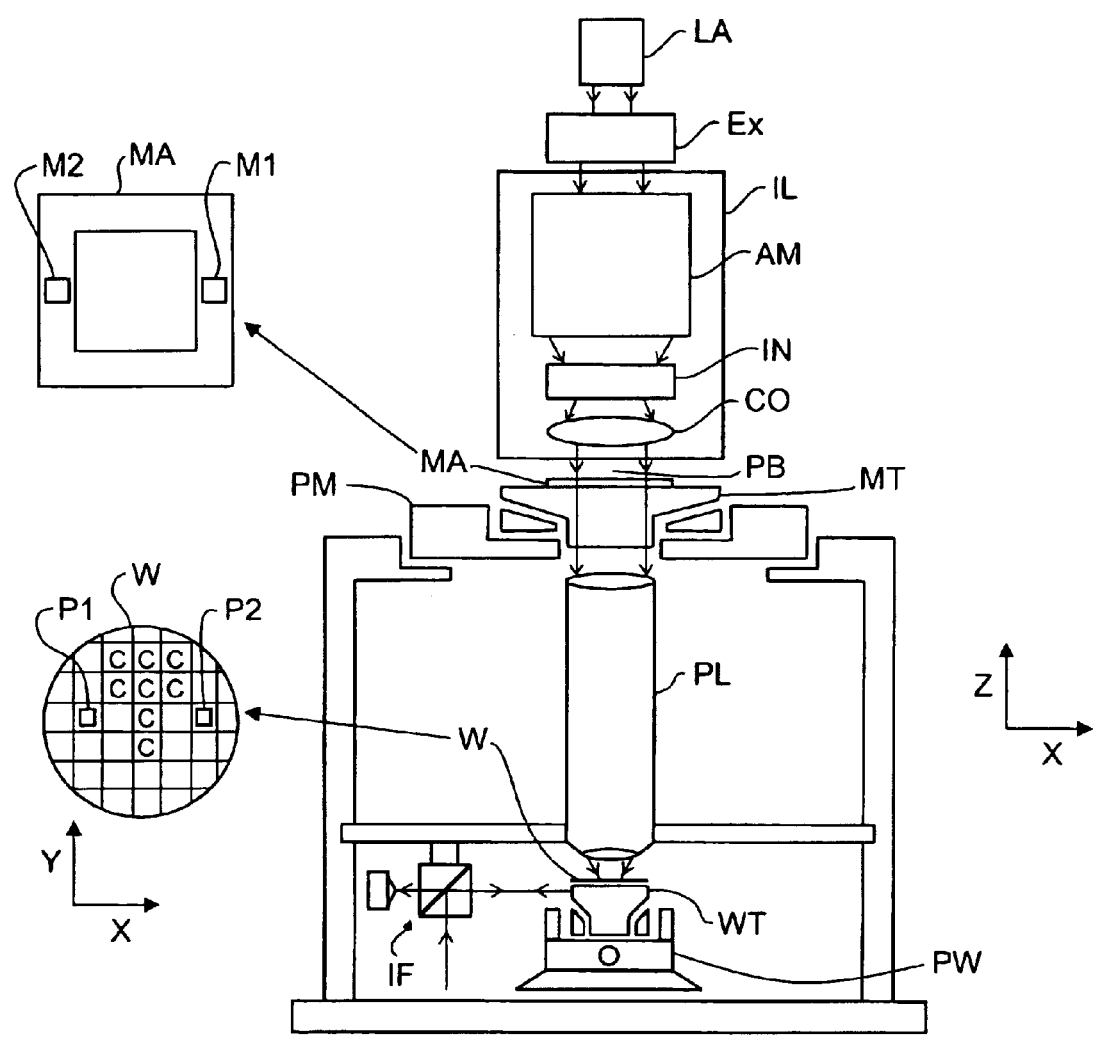
FIG. 1 depicts a lithographic projection apparatus according to an embodiment of the invention.

FIG. 1 schematically depicts a lithographic projection apparatus 1 according to a particular embodiment of the invention. The apparatus comprises:

- a radiation source LA and a beam expander Ex;
- an illumination system IL, for supplying a projection beam PB of radiation (e.g. UV radiation);
- a first object table (mask table) MT provided with a mask holder for holding a mask MA (e.g. a reticle), and connected to first positioning means PM for accurately positioning the mask with respect to item PL;
- a second object table (substrate table) WT provided with a substrate holder for holding a substrate W (e.g. a resist-coated silicon wafer), and connected to second positioning means PW for accurately positioning the substrate with respect to item PL; and
- a projection system ("lens") PL for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. a laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in a pupil plane of the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
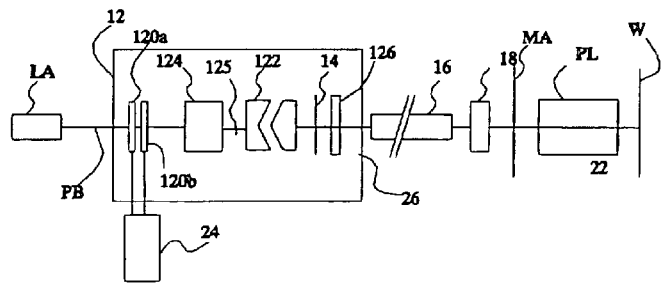
FIG. 2 shows an optical path

FIG. 2 shows a more detailed schematic view of an embodiment of the optical path of the lithographic apparatus, including the illumination system. Beam PB passes from radiation source LA through an angular dependence shaping unit 12, a rod 16, condenser optics 18, mask MA, projection lens PL onto substrate W. Here and in the following the word "lens" should be understood as a general term, referring not just to a single piece of optically shaped glass, but more generally including various types of optically active systems, including refractive optics, reflective optics, and catadioptric systems, composed of a single element or of a combination of elements. Furthermore, it should be understood that, although a straight optical path is shown for the sake of simplicity, without deviating from the invention various mirrors may be included into the optical path so as to introduce angles into the optical path in practice.

Angular dependence shaping unit 12 contains a series arrangement of DOE's 120a–b (Diffractive Optical Elements) in the path of projection beam PB. By way of example, two such DOE's 120a–b have been shown in series, but it should be appreciated that a higher number of such elements may be used in series. The series arrangement of DOE's is followed by a zoom lens 124, a blocking element 125, an axicon 122, and a coupling lens 126 in the path of beam PB. The optical path defines a pupil plane 14 for illuminating mask MA. Pupil plane 14 lies between zoom lens 124 and coupling lens 126. A DOE exchange unit 24 is provided, implemented for example as a pair of carrousels for exchanging DOE's 120a,b with different DOE's from the exchange unit 24. In operation angular dependence shaping unit 12 controls a position dependence of the intensity of beam PB in pupil plane 14. The position dependence in turn determines the way the intensity of the beam at mask MA depends on the angle of incidence. In this context, the word "angle" refers to directions relative to a main direction of beam PB.

Figure 3:
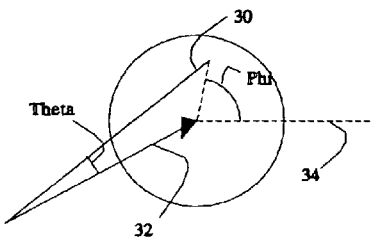
FIG. 3 illustrates directions relative to a main beam direction

FIG. 3 illustrates directions in terms of two angle values Theta and Phi. Theta represents an angle of deflection of a direction 30 of radiation from the main direction 32 of beam PB and Phi represents an angle of rotation around the main direction 32 of the beam from a reference direction 34.

For semi-conductor processing purposes, among others, it is desirable to be able to control the intensity distribution of beam PB as a function of Theta and Phi at patterning device MA and thereby at substrate W. Axicon 122 and zoom lens 124 serve to select an adjustable ring, i.e. a range of Theta values to which the intensity is limited at substrate W. This corresponds to intensity limited to a ring of positions in pupil plane 14. DOE's 120a,b are used to select at least the Phi dependence, to provide for example a dipole shaped pattern, wherein the intensity is concentrated in a range of phi values between plus and minus 45 degrees and between 135 and 225 degrees for example. This corresponds to intensity limited to lobes or positions in these directions in pupil plane 14.

The series arrangement of two DOE's 120a,b is provided for composing desired angle dependent intensity distributions for illuminating substrate W. Each DOE 120a,b is designed to pass beam PB mainly unaffected, breaking the direction of a part of the radiation in the beam with a predetermined angle dependence. Beam PB reaches first DOE 120a mainly collinearly so that a first part of the beam is deflected over a first range of directions determined by first DOE 120a. Most of beam PB passes first DOE 120a collinearly and reaches second DOE 120b where a second part of beam PB is deflected over a second range of directions determined by second DOE 120b. Most of the first part is passed unaffected by second DOE 120b. A minor further part of the first part is again redirected. As a result, beam PB leaves the series arrangement of DOE's partly unaffected and partly deflected: a first part deflected over a first range determined by first DOE 120a, a second part deflected over a second range determined by second DOE 120b and a further part deflected twice.

Zoom lens 124 scales adjustably the ring and images it onto pupil plane 14. Axicon 122 replaces radiation that has been passed by DOE's 120a,b outward over an adjustable distance, so that a ring of intensity, adjustable in radial position, remains. Blocking element 125 blocks the undeflected part of beam PB. As a result the intensity as a function of position in pupil plane 14 is a sum of the first part and the second part of the beam PB that have been deflected by the first and second DOE 120a,b respectively and the further part, but the latter is only a minor part.

Figure 6:
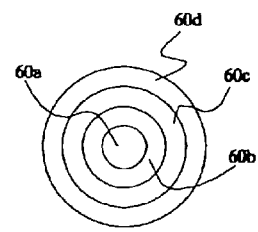
FIG. 6 shows a series of rings in the pupil plane

Thus, by selecting different combinations of first and second DOE's 120a,b different intensity distributions can be composed at the pupil plane. For example the apparatus may be provided with a set of DOE's for each of a number of rings in the pupil plane. FIG. 6 illustrates such a series of rings 60a–d, including a central disk in the pupil plane. Preferably, a set of one or more DOE's (or other optical elements) is provided for each ring 60a–d, respective ones of the DOE's (or other optical elements) of the set for a particular ring 60a–d defining respective intensity distributions limited to the particular ring 60a–d, each for example having intensity only over its own range of angles around the centre of the rings (e.g. one DOE with intensity from 0–22.5 degrees, 90–112.5 degrees, 180–202.5 degrees and 270–290.5 degrees, and others with different ranges). It will be appreciated that, without deviating from the invention, the optical elements of one set may contribute some intensity in the range of another set, but the optical elements of each set contribute more to the position dependence in its range than the optical elements of the other sets. By selecting a DOE for each of the rings and placing the DOE's selected for different rings in series a desired pattern can be composed. Optionally, moreover, each DOE may be rotated to rotate the selected ranges.

Obviously, other sets of DOE's may be used, for example each with respective intensity distributions for a different row or column in pupil plane 14. Or a set of DOE's each providing intensity in a respective region in a grid of regions in pupil plane 14. It is also possible to place DOE's in series that provide intensity in overlapping regions in pupil plane 14. Thus, an intensity pattern may be realized that assumes more than one value in addition to zero intensity.

Figure 4:
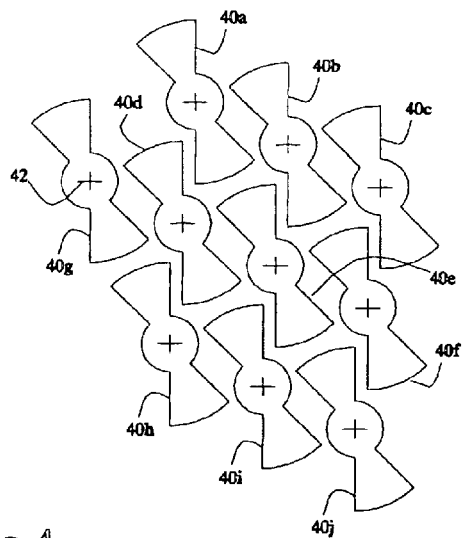
FIG. 4 shows an array of microlenses

DOE's 120a,b are preferably arranged as an array of microlenses each with the same shape in a plane perpendicular to the main beam direction. FIG. 4 shows part of such an array of microlenses 40a–j for a dipole shape. All microlenses 40a–j have the dipole shape around an optical centre (marked with a cross 42). Of course the dipole shape of FIG. 4 is only an example. In another embodiment, ring segment shaped elements may be used. Exactly at the optical centre 42 beam PB is passed without deflection. At increasing distances from optical centre 42 beam PB is increasingly deflected, typically toward the central axis of the microlens 40a–j, so that all rays converge at a common focus. The radiation in beam PB is deflected more than a minimum amount by each lens only in selected regions corresponding to a range of rotation from 90 to 120 degrees around the beam and in a range of 270 to 300 degrees. This results in intensity concentrated in a corresponding range of locations in pupil plane 14. In order to minimize divergence of the part that is deflected less than the minimum the central part of each microlens may be manufactured with constant thickness. In this case all intensity due to the circular central part is substantially concentrated in one point of pupil plane 14, from which it is blocked out.

DOE's are generally realized starting from a desired thickness profile d(r) as a function of position r in the plane of the lens. However, it is desirable to restrict the range of thickness variation. For this purpose, it has been known to make the thickness d'(r) of the DOE vary as a function of position r approximately as this thickness d(r) modulo a basic thickness d0 related to the wavelength of the radiation in beam PB, that is, to obtain d'(r) by subtracting a position r dependent integer number of basic thicknesses d0 from d(r), so that d' remains within a limited range (in this case a range of one basic thickness d0). Thus, when d(r) increases continuously, d'(r) drops back by one basic thickness each time d(r) crosses an integer number of basic thicknesses. Preferably, to obtain optimal efficiency, the basic thickness d0 is chosen so that the diffraction grating effect caused by the drops in thicknesses leads to constructive interference in the direction in which the sloping d(r) refracts the radiation. For small slopes of d(r) d0 may be chosen substantially equal to the wavelength of the radiation.

It should be realized that the essential point of such DOE's is that the thickness steps related to an integer number of wavelengths are used to counteract a continuous rise or fall of the thickness, in order to keep the thickness within some desired range. Use of wavelength related steps and restriction of steps to positions r where d(r) assumes values from a set of values that are an integer number of basic thickness values apart ensure a minimum range of thickness variations, but is not essential. In different embodiments any integer number of basic thickness values may be used in the steps, so that d'(r) drops back by any number of basic thickness values. Also the drops may occur anywhere. This does not significantly affect the operation of the lens.

When designed with steps that are chosen for optimal efficiency for the wavelength of (substantially monochromatic) radiation source LA, however, such a DOE is of no use for the invention, because it does not pass a major part of the beam unaffected. In this case putting several such DOE's in series results in convolution of the position dependencies of the intensity in pupil plane 14 that would be imparted by the individual DOE's and not in addition of these position dependencies.

In the DOE's 120a,b for use in the invention, preferably DOE's designed for a different wavelength than the wavelength of the (monochromatic) radiation of beam PB is used. The efficiency of the DOE, more in particular the ratio between the intensity of radiation that is deflected in the proper direction for lens effects and the intensity of undeflected radiation, attains a maximum for an optimal basic thickness step. A lower efficiency occurs when a thickness step substantially smaller or higher than the wavelength is made each time to check a continuous rise or drop of the thickness. With such a "wrong" thickness step DOE's 120a,b work only partly as lenses, and pass the major part of beam PB essentially unaffected. This makes it possible to obtain the sum of the effect of successive DOE's 120a,b in the serial arrangement. A 'wrong' wavelength of 633 nm (e.g. a red laser-pointer) already gives a satisfactory level of unaffected transmission for 193 nm DOE's. Of course, this effect is not limited to steps that are smaller than the wavelength. One may also use larger steps.

It should be realized however that, although use of such DOE's designed for smaller wavelengths is preferred, partly passing beam PB unaffected and party deflecting beam PB may be realized in different ways. For example, an array of microlenses may be used, wherein a constant optical thickness part is included in each microlens, which covers a major part of the microlens for example in the middle of the microlens. Alternatively, constant thickness element may be included in the array of microlenses, interspersed with the microlenses.

Without deviating from the invention it is possible to use an array of microlenses that pass a major part of beam PB through a central area, which deflects the radiation less than a threshold level, a minor part of beam PB being deflected more, in an angle dependent pattern (for example according to a dipole pattern). In the series arrangement 120a,b the small deflection of the major part by the first DOE 120a leads to an amount of widening of the pattern created by the second DOE 120b, but this is acceptable as long as it remains below a threshold. In this embodiment the combination of DOE's passes a widened central part of beam PB to pupil plane 14, which increases with the threshold.

In this case, passing a major part of beam PB is realized by using a corresponding major part of the area of the lens in the centre of the lens. This requires blocking an increasingly larger area of pupil plane when the major part is increased. This makes it impossible to provide intensity in a central area of pupil plane 14. To reduce this "excluded" area it is desirable that the major part of beam PB is passed deflected to a minimum extent, preferably less than the amount of deflection obtained by using a correspondingly major part of the area of the lens. This is realized for example by using a constant thickness area in a major part of the lens area, or by interspersing constant thickness regions between the microlenses (preferably in each unit cell of the array of microlenses) or by using a DOE designed for a smaller wavelength than the wavelength of radiation source LA.

Furthermore, preferably arrays of microlenses are used wherein a continuously varying thickness is approximated by discrete thickness steps, for example of a fraction of the maximum thickness step. Herein, a continuously changing profile is approximated by a staircase thickness profile with steps that are typically a fraction of the maximum thickness step, the staircase dropping back a maximum thickness step at some positions so as to limit the number of discrete thickness levels. Such a profile can be conveniently manufactured using photolithographic process steps that are familiar from semi-conductor manufacturing techniques. Designed for the "wrong" wavelength it may be used to obtain addition of position dependencies in pupil plane 14.

Figure 5:
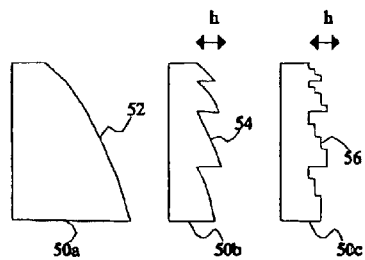
FIG. 5 shows a series of partial cross-sections of microlenses

FIG. 5 shows a series of partial cross-sections of different microlenses 50a–c, with a continuous thickness profile 52, a modulo thickness profile 54 with steps with size h that restrict the range of thickness values of the microlens, and a quantized thickness profile 56 with thickness variation implemented using a series of discrete levels respectively. Preferably the step size h in the microlenses used in DOE;s 120a,b is smaller than the wavelength of radiation source LA.

While specific embodiments of the invention have been described above, it will be appreciated that the invention may be practiced otherwise than as described. The description is not intended to limit the invention. For example, a greater number of DOE's than the two DOE's 120a,b may be used in series to provide for more detailed control over the intensity distribution in pupil plane 14. As another example, although an axicon 122 and a zoom lens 124 have been shown, the function of any of these elements may of course be implemented by means of DOE's.

Furthermore, although blocking element 125 has been shown positioned in front of axicon 122, blocking element may in fact be included at any convenient location in or near any pupil plane, provided that blocking element 125 blocks out radiation that has passed the series arrangement of DOE's 120a–b undeflected, before it reaches the substrate. In principle the diameter of blocking element 125 may be very small, particularly if the blocking element is located exactly in a pupil plane since it needs to block out radiation in only one point of the pupil plane, plus a surrounding corresponding to tolerances for unintended deflection errors. However, when a central part of a lens is used to pass the beam deflected less than a threshold, a correspondingly larger diameter should be used for blocking element 125.

What is claimed is:

1. A lithographic apparatus comprising:
   an illumination system to provide a projection beam of radiation, the illumination system defining an intensity distribution in a pupil plane, the illumination system comprising a first optical element constructed and arranged to deflect the projection beam over a first range of directions with a direction dependent intensity distribution determined by the optical element;
   a support structure to support a patterning device, the patterning device serving to pattern the projection beam according to a desired pattern;
   a substrate table to hold a substrate; and
   a projection system to project the patterned beam onto a target portion of the substrate;
   a second optical element optically following said first optical element in a path of the projection beam, the first optical element and the second optical element each being arranged to pass a major part of the projection beam substantially without deflection, the second optical element deflecting a portion of the major part of the projection beam passed by the first optical element over a second range of directions with a direction dependent intensity distribution; and a transmission blocking element to block transmission to the substrate of the part of intensity of the projection beam passed undeflected by both the optical element and the second optical element.

2. A lithographic apparatus according to claim 1, comprising a plurality of further optical elements, successively following said first optical element in the path of the projection beam, each further optical element passing a major part of the projection beam incident thereon substantially without deflection, and each providing for deflection of the projection beam received from the preceding optical elements over a respective range of directions with a respective further direction dependent intensity distribution.

3. A lithographic apparatus according to claim 1, wherein the first optical element and the second optical element provide for mutually different direction dependent intensity distributions as a function of an angle of rotation around a normal beam direction.

4. A lithographic apparatus according to claim 3, wherein the first optical element provides for an intensity distribution with one of a first intensity level and a zero intensity level as a function of rotation around the normal beam direction, the second optical element providing for an intensity distribution with one of a second intensity level different from the first intensity level and a zero intensity level as a function of rotation around the normal beam direction.

5. A lithographic apparatus according to claim 1, wherein each optical element contains an array of microlenses across a cross-section of the beam.

6. A lithographic apparatus according to claim 5, wherein the radiation source is substantially monochromatic at a first wavelength, the microlenses each include thickness steps so as to keep a range of thickness values of the microlenses within a predetermined range and to optimize efficiency of the microlenses at a second wavelength, the first wavelength differing from the second wavelength such that the efficiency at the first wavelength is low relative to the efficiency at the second wavelength.

7. A lithographic apparatus according to claim 1, comprising an optical element exchange unit, the exchange unit comprising a storage unit having a plurality of positions for premanufactured optical elements, each optical element providing for a respective direction dependent intensity distribution, the exchange unit being arranged to allow movement of at least a selected one of the premanufactured optical elements to a position in the lithographic apparatus to function as said second optical element.

8. A lithographic apparatus according to claim 7, comprising a plurality of respective sets of optical elements, each respective set containing one or more optical elements that determine the intensity in the pupil plane in a respective range of positions specific to the respective set, the exchange unit being arranged to place independently selectable ones of the premanufactured optical elements of the respective sets into successively different positions in a series arrangement.

9. A device manufacturing method comprising:

providing a substrate that is at least partially covered by a layer of radiation-sensitive material;

providing a projection beam of radiation using an illumination system;

deflecting a projection beam of radiation with a first optical element over a range of directions with a direction dependent intensity distribution determined by the optical element and passing a major part of the beam substantially without deflection;

patterning the projection beam with a pattern in its cross-section; and projecting the patterned beam of radiation onto a target portion of a layer of radiation-sensitive material on a substrate;

deflecting the passed portion of the projection beam over a further range of directions with a direction dependent intensity distribution with a second optical element and passing a major part of the projection beam substantially without deflection; and blocking transmission to the substrate of the part of the projection beam passed undeflected by both the first optical element and the second optical element.

10. A device manufacturing method according to claim 9, further comprising passing the projection beam through a plurality of further optical elements, each further optical element passing a major part of the projection beam substantially without deflection, and each providing for deflection of the major part of the passed intensity of the projection beam received from the preceding optical elements over a respective range of directions with a respective further direction dependent intensity distribution.

11. A device manufacturing method according to claim 9, wherein the optical element and the further optical element provide for mutually different direction dependent intensity distributions, as a function of an angle of rotation around the normal beam direction.

12. A device manufacturing method according to claim 11, wherein the first optical element provides for an intensity distribution with one of a first intensity level and a zero intensity level as a function of rotation around the normal beam direction, the second optical element providing for an intensity distribution with one of a second intensity level different from the first intensity level and a zero intensity level as a function of rotation around the normal beam direction.

13. A device manufacturing method according to claim 9, wherein each optical element contains an array of microlenses across a cross-section of the beam.

14. A device manufacturing method according to claim 13, wherein the radiation is substantially monochromatic at a first wavelength, the microlenses each include thickness steps so as to keep a range of thickness values of the microlenses within a predetermined range and to optimize efficiency of the microlenses at a second wavelength, the first wavelength differing from the second wavelength such that the efficiency at the first wavelength is low relative to the efficiency at the second wavelength.

15. A device manufacturing method according to claim 9, further comprising selecting a series of optical elements, from a respective one of a plurality of sets of optical elements for determining an intensity distribution in the pupil plane and placing the selected optical elements in series in the projection beam.

16. A device manufacturing method according to claim 9, wherein the first optical element and the second optical element are part of a series of optical elements that each pass a majority of the projection beam undeflected, each optical element of the series determining a rotation angle dependent intensity distribution in a respective ring around a centre of the pupil plane.

17. A device manufacturing method according to claim 16, the method comprising rotating the optical elements of the series so as to rotate the rotation angle dependent intensity distribution.

18. An illumination optical system for use in a lithographic projection apparatus, comprising:

a first optical element constructed and arranged to deflect a portion of a beam of radiation over a first range of directions with a direction dependent intensity distribution determined by the first optical element, such that a first deflected portion of the beam has less energy than a first undeflected portion of the beam;

a second optical element optically following said first optical element in a path of the projection beam and constructed and arranged to deflect a portion of the first undeflected portion of the beam from the first optical element, and producing a second direction dependent intensity distribution determined by the second optical element, such that a second deflected portion of the beam has less energy than a second undeflected portion of the beam; and a blocking element to block transmission to the substrate of the second undeflected portion.

* * * * *